US012631687B2

(12) United States Patent
Liu et al.

(10) Patent No.:     US 12,631,687 B2
(45) Date of Patent:        May 19, 2026

(54) ARC DISCHARGE DETECTION METHOD AND DETECTION DEVICE FOR BATTERY SYSTEM, AND BATTERY ENERGY STORAGE SYSTEM

(71) Applicant: GOODWE TECHNOLOGIES CO., LTD., Suzhou (CN)

(72) Inventors: Bin Liu, Suzhou (CN); Zengkun Ning, Suzhou (CN); Min Huang, Suzhou (CN); Gang Fang, Suzhou (CN); Jinjun Lu, Suzhou (CN); Nan Xu, Suzhou (CN); Tao Liu, Suzhou (CN)

(73) Assignee: Goodwe Technologies Co., Ltd., Suzhou (CN)

( * ) Notice: Subject to any disclaimer, the term of this patent is extended or adjusted under 35 U.S.C. 154(b) by 207 days.

(21) Appl. No.: 18/261,474

(22) PCT Filed: Jan. 13, 2022

(86) PCT No.: PCT/CN2022/071776
§ 371 (c)(1),
(2) Date: Jul. 13, 2023

(87) PCT Pub. No.: WO2022/152199
PCT Pub. Date: Jul. 21, 2022

(65) Prior Publication Data
US 2024/0077544 A1      Mar. 7, 2024

(30) Foreign Application Priority Data
Jan. 14, 2021    (CN) ......................... 202110045797.7

(51) Int. Cl.
*G01R 31/3842*       (2019.01)
*G01R 31/367*        (2019.01)
*H02H 7/18*          (2006.01)

(52) U.S. Cl.
CPC ....... *G01R 31/3842* (2019.01); *G01R 31/367* (2019.01); *H02H 7/18* (2013.01)

(58) Field of Classification Search
CPC ..... G01R 31/3842; G01R 31/367; H02H 7/18
See application file for complete search history.

(56) References Cited

U.S. PATENT DOCUMENTS 8,929,036 B2 *   1/2015  Nayak .................. H02H 1/0015
                                                      361/42
12,210,052 B2 *  1/2025  Halalchi ............... G01R 31/14
                        (Continued)

FOREIGN PATENT DOCUMENTS

CN        104360205  A       2/2015
CN        103454535  B   *  12/2015  ............. G01R 31/00
                        (Continued)

OTHER PUBLICATIONS

CN105094116B (Year: 2017).*
                        (Continued)

*Primary Examiner* — Crystal L Hammond
*Assistant Examiner* — Samantha L Faubert
(74) *Attorney, Agent, or Firm* — Knobbe, Martens, Olson & Bear, LLP

(57)                    ABSTRACT

Disclosed are an arc discharge detection method and device for a battery system, and a battery energy storage system. The arc discharge detection method for a battery system comprises: sampling a terminal voltage and a charging and discharging current of a battery system, sampling the terminal voltage of the battery system twice and calculating a first voltage difference value, and sampling the terminal voltage of the battery system and a terminal voltage of an electricity load and calculating a second voltage difference value; performing time domain and frequency domain analysis on the sampled data to obtain corresponding time (Continued)

domain and frequency domain feature values; and on the basis of the time domain and frequency domain feature values and the first and second voltage difference values, determining whether arc discharge features are met, so as to determine whether an arc discharge fault occurs in the battery system.

17 Claims, 1 Drawing Sheet

(56) References Cited

U.S. PATENT DOCUMENTS

| | | | |
|---|---|---|---|
| 2011/0238345 A1* | 9/2011 | Gauthier | G01R 31/002 |
| | | | 324/140 R |
| 2020/0177003 A1 | 6/2020 | Miklis et al. | |

FOREIGN PATENT DOCUMENTS

| | | | | |
|---|---|---|---|---|
| CN | 105094116 B | * | 10/2017 | G05B 23/0208 |
| CN | 107340459 A | * | 6/2019 | G01R 31/1272 |
| CN | 109901025 A | | 6/2019 | |
| CN | 110048375 A | | 7/2019 | |
| CN | 107994866 B | * | 10/2019 | H02S 50/00 |
| CN | 112014701 A | | 12/2020 | |
| CN | 112067961 A | | 12/2020 | |
| CN | 112363070 A | | 2/2021 | |
| DE | 102016219849 A1 | | 4/2018 | |

OTHER PUBLICATIONS

International Search Report and Written Opinion issued for International Patent Application No. PCT/CN2022/071776, dated Mar. 29, 2022 including English translation of ISR in 16 pages.

First Office Action issued in the Chinese Patent Application No. 202110045797.7, dated Feb. 22, 2021 in 22 pages including English translation.

Second Office Action issued in the Chinese Patent Application No. 202110045797.7, dated Mar. 16, 2021 in 21 pages including English translation.

Zhao et al., "Series Arc Fault Detection Method Based on the Analysis of Load Voltage"; China Academic Journal Electronic Publishing House, No. 15, pp. 74-78, Mar. 21, 2016.

Augeard et al., "Numerical Methods for Detecting DC Arc Fault in Lithium-Ion Batteries", 2015 IEEE 61$^{st}$ Holm Conference on Electrical Contacts (Holm), IEEE, Oct. 11, 2015, 8 pages.

Eger et al., "DC Arc Fault Scenarios and Detection Methods in Battery Storage Systems", Fraunhofer-Institut for Solar Energy Systems ISE, ICDCM, www.ise.fraunhofer.de, Jun. 27, 2017, 18 pages.

EPO Communication pursuant to Article 94(3) EPC in European Application No. 22 739 075.4 dated Dec. 12, 2025, 5 pages.

* cited by examiner

ARC DISCHARGE DETECTION METHOD AND DETECTION DEVICE FOR BATTERY SYSTEM, AND BATTERY ENERGY STORAGE SYSTEM

CROSS-REFERENCE TO RELATED APPLICATIONS

This application claims priority to PCT Application No. PCT/CN2022/071776, having a filing date of Jan. 13, 2022, which claims priority to CN Application No. 202110045797.7, having a filing date of Jan. 14, 2021, the entire contents both of which are hereby incorporated by reference.

FIELD OF TECHNOLOGY

The following relates to the field of arc discharge detection technology, and specifically relates to an arc discharge detection method and device for a battery system, and a battery energy storage system with arc discharge detection function.

BACKGROUND

With the development of various green and clean new energy power generation technologies, the application of various battery energy storage systems is becoming increasingly widespread. Similar to the photovoltaic power generation system, the battery energy storage system is also a direct current system. Direct-current arc, a highly hazardous and difficult to detect fault type, may also occur in battery energy storage systems.

Arc discharge detection for battery systems can prevent accidents caused by partial direct-current arcs, improve the safety of the battery systems, and protect the safety of users' lives and property. Therefore, arc discharge detection for battery energy storage systems is very necessary. However, at present, there are few studies on arc discharge detection for battery energy storage systems, and the current detection strategies are relatively rigid, which cannot ensure the missed detection or false detection of the arc discharge of battery systems. For example, the Chinese invention application with patent publication number CN 110048375A adopts a method of sampling electrical signals from various electrical connection points within a battery system and determining whether an arc discharge fault occurs in the battery system based on the frequency domain amplitude of the electrical signals. However, this implementation ignores under the condition of external loads, the changes of working conditions of the energy storage system, for example, rapid changes of charging and discharging currents, and rapid switching of charging and discharging modes, may cause fluctuation in the electrical signals at the electrical connection points within the battery system, leading to false or missed detection of arc discharge faults in the battery system.

There is a lack of an accurate and reliable solution for arc discharge fault detection of battery systems.

SUMMARY

The purpose of the present disclosure is to provide an arc discharge detection method and device for a battery system for performing arc discharge detection on a battery system (energy storage system) to ensure the safety of the battery system (energy storage system).

To achieve the above purpose, technical solutions employed by the present disclosure are given below:

An arc discharge detection method for a battery system, configured for detecting whether an arc discharge fault occurs in the battery system, and the arc discharge detection method for a battery system comprises:

sampling a terminal voltage of the battery system twice and calculating a voltage difference value as a first voltage difference value, and/or sampling a terminal voltage of the battery system and a terminal voltage of an electricity load connected to the battery system at the same time and calculating a voltage difference value as a second voltage difference value;

sampling a terminal voltage of the battery system, and performing time domain analysis and/or frequency domain analysis on a sampled terminal voltage data of the battery system to obtain a voltage time-domain feature value and/or a voltage frequency-domain feature value of the battery system; and/or sampling a charging and discharging current of the battery system, and performing time domain analysis and/or frequency domain analysis on a sampled charging and discharging current data of the battery system to obtain a current time-domain feature value and/or a current frequency-domain feature value of the battery system;

on the basis of at least one of the current time-domain feature value, the current frequency-domain feature value, the voltage time-domain feature value and the voltage frequency-domain feature value, and at least one of the first voltage difference value and the second voltage difference value, determining whether an arc discharge fault occurs in the battery system.

Optionally, on the basis of two or more of the current time-domain feature value, the current frequency-domain feature value, the voltage time-domain feature value and the voltage frequency-domain feature value, and the first voltage difference value and the second voltage difference value, it is determined whether an arc discharge fault occurs in the battery system; or, on the basis of one of the current time-domain feature value, the current frequency-domain feature value, the voltage time-domain feature value and the voltage frequency-domain feature value, and the first voltage difference value and the second voltage difference value, it is determined whether an arc discharge fault occurs in the battery system; or, on the basis of at least two of the current time-domain feature value, the current frequency-domain feature value, the voltage time-domain feature value and the voltage frequency-domain feature value, and one of the first voltage difference value and the second voltage difference value, it is determined whether an arc discharge fault occurs in the battery system; or, on the basis of one of the current time-domain feature value, the current frequency-domain feature value, the voltage time-domain feature value and the voltage frequency-domain feature value, and one of the first voltage difference value and the second voltage difference value, it is determined whether an arc discharge fault occurs in the battery system.

Further, criteria for judging whether at least one of the current time-domain feature value, the current frequency-domain feature value, the voltage time-domain feature value and the voltage frequency-domain feature value, and at least one of the first voltage difference value and the second voltage difference value meet arc discharge feathers comprise: criterion 1: the current time-domain feature value exceeds a preset current time-domain feature value threshold, criterion 2: the current frequency-domain feature value exceeds a preset current frequency-domain feature value threshold, criterion 3: the voltage time-domain feature value exceeds a preset voltage time-domain feature value threshold, criterion 4: the voltage frequency-domain feature value exceeds a preset voltage frequency-domain feature value threshold; criterion 5: the first voltage difference value exceeds a preset voltage difference threshold of the battery system, criterion 6: the second voltage difference value exceeds a preset threshold for voltage difference between systems;

if at least one of the criterion 5 and the criterion 6 and at least one of the criterion 1, the criterion 2, the criterion 3 and the criterion 4 are satisfied, it is determined that an arc discharge fault occurs in the battery system.

A feasible technical solution is: judging at least one of the criterion 5 and the criterion 6 at the same time when judging at least one of the criterion 1, the criterion 2, the criterion 3 and the criterion 4, and if the criterion 5 or criterion 6 is true and at least one of the criterion 1, the criterion 2, the criterion 3 and the criterion 4 is true, it is determined that an arc discharge fault occurs in the battery system.

Another feasible technical solution is: judging the criterion 5 and the criterion 6 first, and if the first voltage difference value does not exceed the preset voltage difference threshold of the battery system and the second voltage difference value does not exceed the preset threshold for voltage difference between systems, it is determined that there is no arc discharge fault in the battery system. If not, judging at least one of the criterion 1, the criterion 2, the criterion 3 and the criterion 4, and if at least one of the criterion 1, the criterion 2, the criterion 3 and the criterion 4 is true, determining that an arc discharge fault occurs in the battery system; if not, it is determined that there is no arc discharge fault in the battery system.

Still another feasible technical solution is: judging at least one of the criterion 1, the criterion 2, the criterion 3 and the criterion 4, and if the result is that none of the criteria is true, it is determined that there is no arc discharge fault in the battery system. If not, judging the criterion 5; if the criterion 5 is true, it is determined that an arc discharge fault occurs in the battery system; if not, continuing to judge the criterion 6; if the criterion 6 is true, it is determined that an arc discharge fault occurs in the battery system; if not, it is determined that there is no arc discharge fault in the battery system; or, if at least one of the criterion 1, the criterion 2, the criterion 3 and the criterion 4 is true, judging the criterion 6; if the criterion 6 is true, it is determined that an arc discharge fault occurs in the battery system; if not, continuing to judge the criterion 5; if the criterion 5 is true, it is determined that an arc discharge fault occurs in the battery system; if not, it is determined that there is no arc discharge fault in the battery system.

Further, the voltage difference threshold of the battery system and/or the threshold for voltage difference between systems is obtained by the following:

carrying out an arc discharge test of the battery system under arc discharge conditions of the battery system and collecting arc discharge data of the first voltage difference value, carrying out an arc discharge-free test of the battery system under arc discharge-free conditions of the battery system and collecting arc discharge-free data of the first voltage difference value, and based on the arc discharge data and the arc discharge-free data of the first voltage difference value, obtaining an intermediate critical value of the two and determining it as the voltage difference threshold of the battery system; and/or carrying out an arc discharge test of the battery system under arc discharge conditions of the battery system and collecting arc discharge data of the second voltage difference value, carrying out an arc discharge-free test of the battery system under arc discharge-free conditions of the battery system and collecting arc discharge-free data of the second voltage difference value, and based on the arc discharge data and the arc discharge-free data of the second voltage difference value, obtaining an intermediate critical value of the two and determining it as the threshold for voltage difference between systems.

Further, the current time-domain feature value threshold and/or the current frequency-domain feature value threshold and/or the voltage time-domain feature value threshold and/or the voltage frequency-domain feature value threshold is obtained by the following:

carrying out an arc discharge test of the battery system under arc discharge conditions of the battery system and collecting arc discharge data of the charging and discharging current of the battery system, carrying out an arc discharge-free test of the battery system under arc discharge-free conditions of the battery system and collecting arc discharge-free data of the charging and discharging current of the battery system, and performing time domain analysis on the arc discharge data and the arc discharge-free data of the charging and discharging current of the battery system to obtain arc discharge data and arc discharge-free data of the time-domain feature value of the charging and discharging current of the battery system, and obtaining an intermediate critical value of the two and determining it as the current time-domain feature value threshold; and/or carrying out an arc discharge test of the battery system under arc discharge conditions of the battery system and collecting arc discharge data of the charging and discharging current of the battery system, carrying out an arc discharge-free test of the battery system under arc discharge-free conditions of the battery system and collecting arc discharge-free data of the charging and discharging current of the battery system, and performing frequency domain analysis on the arc discharge data and the arc discharge-free data of the charging and discharging current of the battery system to obtain arc discharge data and arc discharge-free data of the frequency-domain feature value of the charging and discharging current of the battery system, and obtaining an intermediate critical value of the two and determining it as the current frequency-domain feature value threshold; and/or carrying out an arc discharge test of the battery system under arc discharge conditions of the battery system and collecting arc discharge data of the terminal voltage of the battery system, carrying out an arc discharge-free test of the battery system under arc discharge-free conditions of the battery system and collecting arc discharge-free data of the terminal voltage of the battery system, and performing time domain analysis on the arc discharge data and the arc discharge-free data of the terminal voltage of the battery system to obtain arc discharge data and arc discharge-free data of the time-domain feature value of the terminal voltage of the battery system, and obtaining an intermediate critical value of the two and determining it as the voltage time-domain feature value threshold; and/or carrying out an arc discharge test of the battery system under arc discharge conditions of the battery system and collecting arc discharge data of the terminal voltage of the battery system, carrying out an arc discharge-free test of the battery system under arc discharge-free conditions of the battery system and collecting arc discharge-free data of the terminal voltage of the battery system, and performing frequency domain analysis on the arc discharge data and the arc discharge-free data of the terminal voltage of the battery system to obtain arc discharge data and arc discharge-free data of the frequency-domain feature value of the terminal voltage of the battery system, and obtaining an intermediate critical value of the two and determining it as the voltage frequency-domain feature value threshold.

Further, the arc discharge detection method for a battery system further comprises determining a position of the arc discharge occurrence through the following ways after determining that an arc discharge fault has occurred in the battery system:

judging whether the criterion 5 is true; if yes, determining that the arc discharge occurs at an internal connection point of the battery system.

Further, the arc discharge detection method for a battery system further comprises determining a position of the arc discharge occurrence through the following ways after determining that an arc discharge fault has occurred in the battery system:

judging whether the criterion 6 is true; if yes, determining that the arc discharge occurs between the battery system and the electricity load.

In another aspect, the present disclosure provides an arc discharge detection device for a battery system, which is configured for detecting whether an arc discharge fault occurs in the battery system, and the arc discharge detection device for a battery system comprises:

a sensor module, configured to sample a terminal voltage and a charging and discharging current of the battery system, and to sample a terminal voltage of an electricity load connected to the battery system;

a processor module, the processor module being connected to the sensor module, and configured to process sampled data from the sensor module to analyze whether an arc discharge fault occurs in the battery system, which comprises:

calculating a voltage difference value of the terminal voltage of the battery system obtained by two samplings as a first voltage difference value, and/or calculating a voltage difference value between the terminal voltage of the battery system and the terminal voltage of the electricity load connected to the battery system sampled at the same time as a second voltage difference value;

performing time domain analysis and/or frequency domain analysis on a sampled terminal voltage data of the battery system to obtain a voltage time-domain feature value and/or a voltage frequency-domain feature value of the battery system; and/or sampling a charging and discharging current of the battery system, and performing time domain analysis and/or frequency domain analysis on a sampled charging and discharging current data of the battery system to obtain a current time-domain feature value and/or a current frequency-domain feature value of the battery system;

on the basis of at least one of the current time-domain feature value, the current frequency-domain feature value, the voltage time-domain feature value and the voltage frequency-domain feature value, and at least one of the first voltage difference value and the second voltage difference value, determining whether an arc discharge fault occurs in the battery system.

Optionally, the processor module determines whether an arc discharge fault occurs in the battery system on the basis of two or more of the current time-domain feature value, the current frequency-domain feature value, the voltage time-domain feature value and the voltage frequency-domain feature value, and the first voltage difference value and the second voltage difference value; or, the processor module determines whether an arc discharge fault occurs in the battery system on the basis of one of the current time-domain feature value, the current frequency-domain feature value, the voltage time-domain feature value and the voltage frequency-domain feature value, and the first voltage difference value and the second voltage difference value; or, the processor module determines whether an arc discharge fault occurs in the battery system on the basis of at least two of the current time-domain feature value, the current frequency-domain feature value, the voltage time-domain feature value and the voltage frequency-domain feature value, and one of the first voltage difference value and the second voltage difference value; or, the processor module determines whether an arc discharge fault occurs in the battery system on the basis of one of the current time-domain feature value, the current frequency-domain feature value, the voltage time-domain feature value and the voltage frequency-domain feature value, and one of the first voltage difference value and the second voltage difference value.

Further, the following criteria are preset in the processor module, and comprises, criterion 1: the current time-domain feature value exceeds a preset current time-domain feature value threshold, criterion 2: the current frequency-domain feature value exceeds a preset current frequency-domain feature value threshold, criterion 3: the voltage time-domain feature value exceeds a preset voltage time-domain feature value threshold, criterion 4: the voltage frequency-domain feature value exceeds a preset voltage frequency-domain feature value threshold; criterion 5: the first voltage difference value exceeds a preset voltage difference threshold of the battery system, criterion 6: the second voltage difference value exceeds a preset threshold for voltage difference between systems; it is determined that an arc discharge fault occurs in the battery system if the processor determines that at least one of the criterion 5 and the criterion 6 and at least one of the criterion 1, the criterion 2, the criterion 3 and the criterion 4 are satisfied.

Further, the arc discharge detection device for a battery system further comprises a filtering and sampling circuit arranged between the sensor module and the processor module for filtering and amplifying a sampled signal output by the sensor module, and transmitting the processed signal to the processor module.

Further, the sensor module comprises a voltage sensor and a current sensor.

Further, the arc discharge detection device for a battery system further comprises a communication circuit, wherein the communication circuit is connected to the processor module and also connected to a controller capable of controlling the switching-on or switching-off of a loop in which the battery system is located, and the processor module is configured to output a trigger signal to the controller through the communication circuit when it is determined that an arc discharge fault has occurred in the battery system.

Further, the processor module is further configured to determine a position of the arc discharge occurrence through the following ways after it is determined that an arc discharge fault has occurred in the battery system:

judging whether the criterion 5 is true; if yes, determining that the arc discharge occurs at an internal connection point of the battery system; and/or, judging whether the criterion 6 is true; if yes, determining that the arc discharge occurs between the battery system and the electricity load.

The present disclosure further provides a battery energy storage system with arc discharge detection function, and thus high safety, the solution thereof is:

a battery energy storage system comprises, a battery system, and a controller for controlling switching-on or switching-off of a loop in which the battery system is located, the battery energy storage system further comprises an arc discharge detection device for a battery system as mentioned above, a processor module of the arc discharge detection device for a battery system is configured to output a trigger signal to the controller through a communication circuit when it is determined that an arc discharge fault has occurred in the battery system, so that the controller disconnects the loop in which the battery system is located. Further, the arc discharge detection device for a battery system is integrated in the battery system or the controller.

Due to the use of the above technical solutions, the present disclosure has the following advantages: By analyzing the different features of arc discharge faults which occur at different positions of the battery system, and combining the time-domain and frequency-domain feature value thresholds of the voltage and current of the battery system where an arc discharge fault occurs, the arc discharge detection method and detection device of the present disclosure can conveniently and accurately perform comprehensive and reliable arc discharge detection for the battery system, and propose a set of arc discharge detection solutions for the battery system to effectively prevent missed detection and false detection, which can improve the safety of the battery system (energy storage system); the battery storage system of the present disclosure is highly safe and can prevent the battery system from catching fire due to arc discharge faults.

BRIEF DESCRIPTION OF THE DRAWINGS

For more clearly explaining the technical solutions in the embodiments of the present disclosure, the accompanying drawings required to be used to in the description of the embodiments will be simply introduced below. Apparently, the drawings in the following description show merely some embodiments of the present disclosure, and those of ordinary skill in the art may derive other drawings from these accompanying drawings without creative efforts.

DETAILED DESCRIPTION

Figure 1:
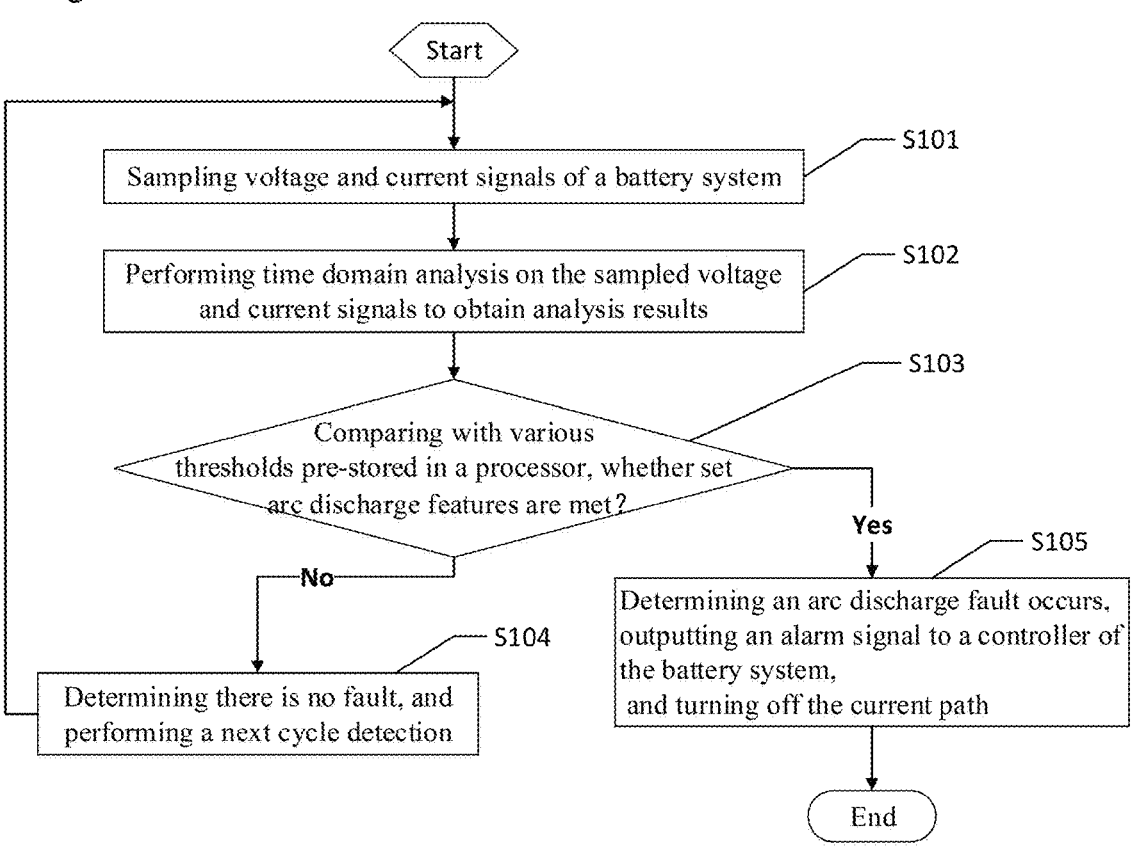
FIG. 1 is a schematic flow chart of an arc discharge detection method for a battery system provided by an exemplary embodiment of the present disclosure.

In order to make those skilled in the art better understand the solutions of the present disclosure, the technical solutions in the embodiments of the present disclosure will be described clearly and completely below with reference to the accompanying drawings in the embodiments of the present disclosure. Apparently, the described embodiments are merely some of rather than all of the embodiments of the present disclosure. All other embodiments obtained by those of ordinary skill in the art without creative efforts based on the embodiments of the present disclosure shall fall within the protective scope of the present disclosure.

It should be noted that terms such as "first" and "second" in the description, the claims and the accompanying drawings of the present disclosure are used to/intended to distinguish similar objects, and do not have to be used to/are not intended to describe a specific order or sequence. It should be understood that data used in this manner may be interchangeable where appropriate, so that the embodiments of the present disclosure described herein can be implemented in an order other than/in addition to those illustrated or described herein. In addition, terms "comprise" and "have" and any other variants thereof are intended to cover non-exclusive inclusion.

Unlike arc detection technology, which is widely used in photovoltaic systems, the direct-current arc detection technology has not yet been used in energy storage systems such as battery systems. The reasons for this may be as follows: first, the upstream battery system manufacturers will test whether the battery system connection point is normally connected before the new battery system leaves the factory, arc discharge is generally difficult to occur, and it is not necessary to carry out arc discharge detection of the battery system; second, the downstream energy storage inverter manufacturers or electric vehicle manufacturers have not yet realized the importance of the arc discharge detection for a battery system, and have not developed the corresponding technology; third, there are no mandatory industry regulations for anti-arc discharge in battery systems yet; fourth, it is believed that there are few connection points for energy storage systems such as battery systems, and there is no need for arc discharge detection at the battery system end.

However, through research, it has been found that the necessity of arc discharge detection on energy storage systems such as battery systems is very high for the following reasons: first, due to the limited capacity of a single battery system, energy storage battery systems and power battery systems on electric vehicles are generally used in the form of battery system packs formed in series and parallel, therefore, as the number of battery systems increases, there are actually many connection points in the energy storage systems, for example, there are dozens of connection points in a 9 kWh small household energy storage system, while electric vehicles usually use thousands of lithium battery systems as power, the number of connection points is bound to be higher, so the direct-current arc discharge fault caused by poor contact of connection points in battery systems is worthy of attention; second, although the new battery systems will undergo various tests before leaving the factory to ensure good contact at the connection points, after transportation, installation, and long-term use under various conditions such as temperatures, humidity, salinity and vibration, it is difficult to ensure that the connection points of these battery systems are still in good contact, and the possibility of direct-current arc discharge faults greatly increases; third, experiments have found that a stable arc can be generated at a distance of only 0.2 mm, and the arc temperature can reach up to thousands of degrees Celsius, it can be imagined that if arc discharge conditions continue to occur in the battery system, such a high temperature environment will ignite the battery system shell, causing fires and even explosions, especially in household energy storage systems and electric vehicles that people can closely contact in daily life, and if arc discharge occurs, the consequences would be unimaginable; fourth, there are many combustion and explosion accidents related to battery systems every year, including accidents caused by direct-current arc discharge faults.

Based on this, the following arc discharge detection method for a battery system (storage battery system) is proposed to reliably detect whether an arc discharge fault occurs in the energy storage system and avoid false detection and missed detection:

An arc discharge detection method for a battery system configured for detecting whether an arc discharge fault occurs in the battery system comprises, sampling a terminal voltage of the battery system and/or a charging and discharging current of the battery system, analyzing and calculating the sampled voltage and/or current data, comparing with reference information of feature values of the battery system pre-stored in a processor, and if arc discharge feature conditions of the battery system are met, outputting an alarm signal to a controller of the battery system or other devices (such as energy storage inverters) that can disconnect the charging and discharging loop of the battery system. As shown in FIG. 1, the arc discharge detection method for a battery system specifically comprises the following steps:

S101: sampling a terminal voltage of the battery system twice at different times and calculating a voltage difference value as a first voltage difference value, and sampling the terminal voltage of the battery system and a terminal voltage of an electricity load connected to the battery system at the same time and calculating a voltage difference value as a second voltage difference value.

S102: sampling a terminal voltage of the battery system, and performing time domain analysis and/or frequency domain analysis on the sampled terminal voltage data of the battery system to obtain a voltage time-domain feature value and/or a voltage frequency-domain feature value of the battery system; and/or sampling a charging and discharging current of the battery system, and performing time domain analysis and/or frequency domain analysis on the sampled charging and discharging current data of the battery system to obtain a current time-domain feature value and/or a current frequency-domain feature value of the battery system.

S103: comparing the data obtained in steps S101 and S102 with various pre-set and stored thresholds or ranges, and judging whether the preset arc discharge features are met, which are specifically as follows:

on the basis of two or more of the current time-domain feature value, the current frequency-domain feature value, the voltage time-domain feature value and the voltage frequency-domain feature value, and the first voltage difference value and the second voltage difference value, determining whether the preset arc discharge features are met to determine whether an arc discharge fault occurs in the battery system.

Criteria for judging whether the arc discharge feathers are met comprise, criterion 1: the current time-domain feature value exceeds a preset current time-domain feature value threshold, criterion 2: the current frequency-domain feature value exceeds a preset current frequency-domain feature value threshold, criterion 3: the voltage time-domain feature value exceeds a preset voltage time-domain feature value threshold, criterion 4: the voltage frequency-domain feature value exceeds a preset voltage frequency-domain feature value threshold; criterion 5: the first voltage difference value exceeds a preset voltage difference threshold of the battery system, criterion 6: the second voltage difference value exceeds a preset threshold for voltage difference between systems. If at least one of the criterion 5 and the criterion 6 and at least one of the criterion 1, the criterion 2, the criterion 3 and the criterion 4 are satisfied, judging that the preset arc discharge features are met, that is, it is determined that an arc discharge fault occurs in the battery system; if not, judging that the preset arc discharge features are not met, and it is determined that there is no arc discharge fault in the battery system. Generally, it is necessary to satisfy at least three of the above criteria to determine that an arc discharge fault occurs in the battery system. Taking that at least one of the criterion 5 and the criterion 6 is true as condition A, and that at least one of the criteria 1-4 is true as condition B, an embodiment of the present disclosure uses the form of condition A "logical AND" condition B to determine whether an arc discharge fault occurs in the battery system, which can effectively ensure the accuracy of the arc discharge detection system and effectively prevent the false detection of arc discharge faults; the present disclosure does not limit the determination of all the criterion 1, the criterion 2, the criterion 3, and the criterion 4 one by one, instead, one or more of these criteria can be selected for determination, of course, the four criteria can also be determined, especially in one embodiment of the present disclosure, at least two of the criterion 1, the criterion 2, the criterion 3, and the criterion 4 should be judged, as long as one of them is true, condition B is true, which can effectively prevent missed detection of the occurrence of arc discharge faults.

The above steps S101 and S102 are parallel steps, and the present disclosure does not limit the order in which they are executed, and the arc discharge detection steps for different battery systems in different order are described in detail below:

In Embodiment I of the present disclosure, judging the criterion 5 and the criterion 6 first, and if the first voltage difference value does not exceed the preset voltage difference threshold of the battery system and the second voltage difference value does not exceed the preset threshold for voltage difference between systems, it is determined that there is no arc discharge fault in the battery system. If not, judging at least two or more of the criterion 1, the criterion 2, the criterion 3 and the criterion 4, and if at least one of them is true, it is determined that an arc discharge fault occurs in the battery system; if not, it is determined that there is no arc discharge fault in the battery system.

In Embodiment II of the present disclosure, judging at least two or more of the criterion 1, the criterion 2, the criterion 3 and the criterion 4 first, and if the result is that none of the criteria is true, it is determined that there is no arc discharge fault in the battery system. If not, there are two implementations: the first one is continuing to judge the criterion 5; if the criterion 5 is true, determining that an arc discharge fault occurs in the battery system; if not, continuing to judge the criterion 6; if the criterion 6 is true, determining that an arc discharge fault occurs in the battery system; if not, it is determined that there is no arc discharge fault in the battery system. The second one is continuing to judge the criterion 6; if the criterion 6 is true, it is determined that an arc discharge fault occurs in the battery system; if not, continuing to judge the criterion 5; if the criterion 5 is true, it is determined that an arc discharge fault occurs in the battery system; if not, it is determined that there is no arc discharge fault in the battery system.

In Embodiment III of the present disclosure, judging the criterion 5 and the criterion 6 at the same time when judging at least two or more of the criterion 1, the criterion 2, the criterion 3 and the criterion 4, and if the criterion 5 or criterion 6 is true and at least one of the criterion 1, the criterion 2, the criterion 3 and the criterion 4 is true, it is determined that an arc discharge fault occurs in the battery system. For the two embodiments above this embodiment, due to that the probability of arc discharge occurrence is relatively low, especially for new battery systems, it is possible to obtain a judgment conclusion that there is no arc discharge fault in the battery system in advance if the judgment condition A is not true or the judgment condition B is not true, thereby reducing the amount of computing tasks; compared with the above two embodiments, this embodiment has increased computing tasks, but once an arc discharge fault actually occurs, it can quickly determine that an arc discharge fault occurs in the battery system.

In one embodiment of the present disclosure, it can be effectively combined with Embodiment I and Embodiment III, or with Embodiment II and Embodiment III, that is, the arc discharge detection of the battery system is first carried out by means of Embodiment I or embodiment II, the arc discharge fault of the battery system is recorded, and if the recorded number of arc discharge faults in the battery system reaches 1 or a preset number threshold, the method of Embodiment III is switched to perform the arc discharge detection for the battery system. In the initial use stage of a new battery, a low computing task mode can be configured to determine whether an arc discharge fault occurs in the battery system, and in the later stage, a fast-response mode can be configured to determine whether an arc discharge fault occurs in the battery system. The current time-domain feature value mentioned above comprises one or more of the current average value, the variance value, the peak-to-peak value, the effective value, the waveform factor, the current change rate, and the like, the current frequency-domain feature values mentioned above comprises one or more of the spectrum amplitude cumulative sum, the spectrum amplitude change rate, the power spectral density, and the like, the voltage time-domain feature value mentioned above comprises one or more of the voltage average value, the variance value, the peak-to-peak value, the effective value, the waveform factor, and the voltage change rate, and the like, and the voltage frequency-domain mentioned above comprises one or more of the spectral amplitude cumulative sum, the spectral amplitude change rate, and the power spectral density, and the like. The methods for determining the current time-domain feature value threshold, the current frequency-domain feature value threshold, the voltage time-domain feature value threshold and the voltage frequency-domain feature value threshold are described below in detail.

S104: if it is determined that there is no arc discharge fault in the battery system, continuing to a next cycle of detection, and returning to S101 to S103.

S105: if it is determined that an arc discharge fault occurs in the battery system, outputting an alarm signal to the controller of the battery system in which the system is located, and switching off the path where the battery system is located through its control.

In one embodiment of the present disclosure, after it is determined that an arc discharge fault has occurred in the battery system, determining a position of the arc discharge occurrence through the following: judging whether the criterion 5 is true; if yes, it is determined that the arc discharge occurs at an internal connection point of the battery system; and/or, judging whether the criterion 6 is true; if yes, it is determined that the arc discharge occurs between the battery system and the electricity load.

The present disclosure further provides one embodiment, which explains the simplified criteria for determining whether an arc discharge fault occurs in the battery system: in this embodiment, only the first voltage difference value is calculated, and only frequency domain analysis on the sampled charging and discharging current of the battery system is performed, accordingly, only the current frequency-domain feature value threshold and the voltage difference threshold of the battery system can be preset, and if the criterion 5 and the criterion 2 are true, it is determined that an arc discharge fault occurs in the battery system; if not, it is determined that there is no arc discharge fault in the battery system, and repeated detection will be performed until the next cycle. Obviously, according to the mathematical permutation and combination method, there are 42 judgment methods from simple to complex, which are no longer listed here.

Compared with the existing direct-current arc discharge detection method applied to photovoltaic systems, the innovation of the above-mentioned arc discharge detection method applied to battery systems is that, the arc discharge detection method for a battery system introduces sampling and extraction of voltage information. At present, the direct-current arc detection in the photovoltaic system generally only uses the current frequency-domain information, rather than the voltage information, the reason is that even if the arc discharge occurs, the string voltage at the inverter terminal is almost unchanged due to the algorithm control of the inverter in the photovoltaic system. However, in the battery system, because the battery system itself is a stable power supply with almost constant voltage, the arc voltage will be superimposed on the battery system voltage when arc discharge occurs, specifically, the input voltage of the battery system is the sum of the battery system voltage and the arc voltage when arc discharge occurs during charging the battery system, and the output voltage of the battery system is the difference between the battery system voltage and the arc voltage when arc discharge occurs during the battery system discharges. If arc discharge occurs at an internal connection point of the battery system pack, the terminal voltage of the battery system will change due to the arc voltage, that is, the first voltage difference value will be generated, and if arc discharge occurs between the battery system terminal and the electricity load terminal, a voltage difference will be generated between the terminal voltage of the battery system and the terminal voltage of the electricity load at the same time, that is, the second voltage difference value. It is found that the arc voltage reaches about 20 V when the distance between uncontacted connection points is only 0.2 mm, and the arc voltage will increase with the increase of the distance, and the voltage fluctuation of the arc voltage relative to the battery system itself is obvious, so it is reflected in the voltage value of the whole battery system, and there will be a relatively obvious wave, that is, the voltage of the battery system changes significantly when the arc occurs. In addition, when arc discharge occurs, the voltage frequency-domain information of the battery system also contains an arc feature. Therefore, in addition to comparing whether the current time-domain and frequency-domain feature values of the battery system exceed the thresholds, conditions for judging whether the arc discharge features of the battery system are satisfied further comprise: comprehensively judging whether an arc discharge fault occurs in the battery system by comparing whether the terminal voltage of the battery system changes abnormally before and after the time, comparing whether the voltage difference between the terminal voltage of the battery system and the terminal voltage of the electricity load (such as the energy storage inverter) connected thereto at the same time exceeds the threshold, and comparing whether the voltage time-domain and frequency-domain features of the battery system exceed the thresholds.

The above method involves a plurality of preset thresholds, mainly including the current time-domain feature value threshold, the current frequency-domain feature value threshold, the voltage time-domain feature value threshold, the voltage frequency-domain feature value threshold, the voltage difference threshold of the battery system, and the threshold for voltage difference between systems, and the method for obtaining these thresholds is: carrying out an arc discharge test of the battery system under various arc discharge conditions of the battery system and collecting arc discharge data, carrying out an arc discharge-free test of the battery system under various arc discharge-free conditions of the battery system and collecting arc discharge-free data, (artificially) concluding on the basis of the arc discharge data and the arc discharge-free data, to determine the current time-domain feature value threshold, the current frequency-domain feature value threshold, the voltage time-domain feature value threshold, the voltage frequency-domain feature value threshold, the voltage difference threshold of the battery system, and the threshold for voltage difference between systems. Wherein, the method of (artificially) concluding on the basis of the arc discharge data and the arc discharge-free data is obtaining the arc discharge data and the arc discharge-free data of a certain parameter index through experiments, obtaining the intermediate critical value of the arc discharge data and the arc discharge-free data through mathematical methods and determining it as the feature value threshold of this parameter index, and specifically is as follows:

carrying out an arc discharge test of the battery system under arc discharge conditions of the battery system and collecting arc discharge data of the first voltage difference value, carrying out an arc discharge-free test of the battery system under arc discharge-free conditions of the battery system and collecting arc discharge-free data of the first voltage difference value, and based on the arc discharge data and the arc discharge-free data of the first voltage difference value, obtaining an intermediate critical value of the two and determining it as the voltage difference threshold of the battery system;

carrying out an arc discharge test of the battery system under arc discharge conditions of the battery system and collecting arc discharge data of the second voltage difference value, carrying out an arc discharge-free test of the battery system under arc discharge-free conditions of the battery system and collecting arc discharge-free data of the second voltage difference value, and based on the arc discharge data and the arc discharge-free data of the second voltage difference value, obtaining an intermediate critical value of the two and determining it as the voltage difference threshold between systems, and taking that the electricity load is an inverter system as an example, the voltage difference threshold between systems here, namely the voltage difference between the terminal voltage of the battery system and the terminal voltage of the inverter system, is configured as the feature threshold to determine whether an arc discharge fault occurs in the battery system;

carrying out an arc discharge test of the battery system under arc discharge conditions of the battery system and collecting arc discharge data of the charging and discharging current of the battery system, carrying out an arc discharge-free test of the battery system under arc discharge-free conditions of the battery system and collecting arc discharge-free data of the charging and discharging current of the battery system, and performing time domain analysis on the arc discharge data and the arc discharge-free data of the charging and discharging current of the battery system to obtain arc discharge data and arc discharge-free data of the time-domain feature value of the charging and discharging current of the battery system, and obtaining an intermediate critical value of the two and determining it as the current time-domain feature value threshold;

carrying out an arc discharge test of the battery system under arc discharge conditions of the battery system and collecting arc discharge data of the charging and discharging current of the battery system, carrying out an arc discharge-free test of the battery system under arc discharge-free conditions of the battery system and collecting arc discharge-free data of the charging and discharging current of the battery system, and performing frequency domain analysis on the arc discharge data and the arc discharge-free data of the charging and discharging current of the battery system to obtain arc discharge data and arc discharge-free data of the frequency-domain feature value of the charging and discharging current of the battery system, and obtaining an intermediate critical value of the two and determining it as the current frequency-domain feature value threshold;

carrying out an arc discharge test of the battery system under arc discharge conditions of the battery system and collecting arc discharge data of the terminal voltage of the battery system, carrying out an arc discharge-free test of the battery system under arc discharge-free conditions of the battery system and collecting arc discharge-free data of the terminal voltage of the battery system, and performing time domain analysis on the arc discharge data and the arc discharge-free data of the terminal voltage of the battery system to obtain arc discharge data and arc discharge-free data of the time-domain feature value of the terminal voltage of the battery system, and obtaining an intermediate critical value of the two and determining it as the voltage time-domain feature value threshold;

carrying out an arc discharge test of the battery system under arc discharge conditions of the battery system and collecting arc discharge data of the terminal voltage of the battery system, carrying out an arc discharge-free test of the battery system under arc discharge-free conditions of the battery system and collecting arc discharge-free data of the terminal voltage of the battery system, and performing frequency domain analysis on the arc discharge data and the arc discharge-free data of the terminal voltage of the battery system to obtain arc discharge data and arc discharge-free data of the frequency-domain feature value of the terminal voltage of the battery system, and obtaining an intermediate critical value of the two and determining it as the voltage frequency-domain feature value threshold.

Wherein, the arc discharge conditions of the battery system comprise conditions such as the battery system operating in a charging or discharging state, different battery system voltages, different working currents, different arc discharge points at different positions of the battery system, and different arc discharge velocities and arc distances set during artificial arc discharge.

The arc discharge-free data collected by carrying out an arc discharge-free test of the battery system under various arc discharge-free conditions of the battery system are divided into arc discharge-free data recorded under various special application conditions and arc discharge-free data under normal application conditions. The special application conditions of the battery system refer to the operating conditions of the battery system in which no arc discharge occurs but which are prone to result in misjudgment by the detection device, including conditions such as rapid changes of charging and discharging currents caused by the electricity load (such as an energy storage inverter) connected thereto, and rapid switching of charging and discharging modes.

Figure 2:
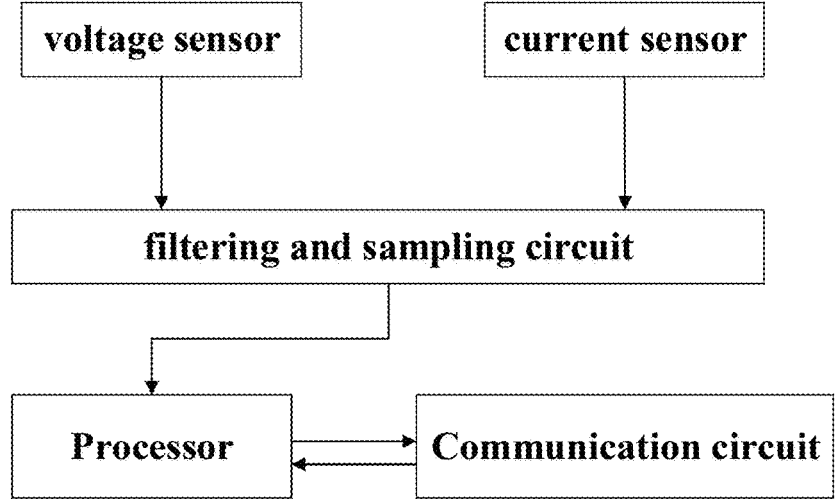
FIG. 2 is a principle block diagram of an arc discharge detection device for a battery system provided by an exemplary embodiment of the present disclosure.

As shown in FIG. 2, an arc discharge detection device for a battery system configured for detecting whether an arc discharge fault occurs in the battery system, comprises a sensor module, a processor module, and a filtering and sampling circuit. The sensor module is configured to sample a terminal voltage and a charging and discharging current of the battery system to obtain terminal voltage data and charging and discharging current data of the battery system, to sample the terminal voltage of the battery system twice, and to sample the terminal voltage of the battery system and a terminal voltage of the electricity load connected to the battery system at the same time, and it comprises a voltage sensor and a current sensor. The filtering and sampling circuit is arranged between the sensor module and the processor module, configured for filtering and amplifying a sampled signal output by the sensor module and transmitting the processed signal to the processor module, and connected to an analog-to-digital conversion access of the processor module. The numbers of current sensors, voltage sensors and filtering and sampling circuits in the sensor module may be increased according to the number of series battery system packs. The processor module is connected to the sensor module through the filtering and sampling circuit, and configured to calculate a voltage difference value of the terminal voltage of the battery system obtained by two samplings as a first voltage difference value, to calculate a voltage difference value between the terminal voltage of the battery system and the terminal voltage of the electricity load connected to the battery system sampled at the same time as a second voltage difference value, perform time domain analysis and frequency domain analysis on the sampled terminal voltage and charging and discharging current of the battery system to obtain the current time-domain feature value, the current frequency-domain feature value, the voltage time-domain feature value and the voltage frequency-domain feature value, judge whether the preset arc discharge features are met on the basis of the current time-domain feature value, the current frequency-domain feature value, the voltage time-domain feature value and the voltage frequency-domain feature value, the first voltage difference value and the second voltage difference value to determine whether an arc discharge fault occurs in the battery system. Wherein, the involved criteria for judging whether the arc discharge feathers are met comprise, criterion 1: the current time-domain feature value exceeds a preset current time-domain feature value threshold, criterion 2: the current frequency-domain feature value exceeds a preset current frequency-domain feature value threshold, criterion 3: the voltage time-domain feature value exceeds a preset voltage time-domain feature value threshold, criterion 4: the voltage frequency-domain feature value exceeds a preset voltage frequency-domain feature value threshold; criterion 5: the first voltage difference value exceeds a preset voltage difference threshold of the battery system, criterion 6: the second voltage difference value exceeds a preset threshold for voltage difference between systems. If at least one of the criterion 5 and the criterion 6 and at least one of the criterion 1, the criterion 2, the criterion 3 and the criterion 4 are satisfied, it is judged that the arc discharge features are met, and it is determined that an arc discharge fault occurs in the battery system. Generally, it is necessary to satisfy at least three of the above criteria to determine that an arc discharge fault occurs in the battery system.

The arc discharge detection device for a battery system of this embodiment belongs to the same concept as the arc discharge detection method for a battery system provided in the above embodiment when performing arc discharge detection, and the specific process for realizing arc discharge detection and judgment is detailed in the method embodiment, that is, all features in the above embodiment of the arc discharge detection method for a battery system can be introduced into the embodiment of the arc discharge detection device for a battery system by reference.

Further, the arc discharge detection device for a battery system further comprises a communication circuit connected to the processor module, and the communication circuit is further connected to a controller capable of controlling switching-on or switching-off of a loop in which the battery system is located. The communication circuit is configured to output a control signal that causes the controller to disconnect the loop in which the battery system is located when it is determined that an arc discharge fault has occurred in the battery system. Therefore, when an arc discharge fault occurs in the battery system, the controller can quickly control the disconnection of the loop in which the battery system is located based on the control signal transmitted from the communication circuit, making the arc lose energy supply and achieve the purpose of extinguishing the arc discharge of the battery system. In addition, the method executed in the processor module can also be updated and iterated through the communication circuit, and the processor module can also regularly upload normal raw data and raw data that determines the occurrence of arc discharge through the communication circuit.

The above-mentioned arc discharge detection device for a battery system can be independently arranged externally, or may be integrated in the controller of the battery system or in the battery system, or may be integrated in the electricity terminal (for example, an energy storage inverter) connected to the battery system. Therefore, a solution of battery energy storage system with arc discharge detection function is as follows: the battery energy storage system comprises a battery system, a controller configured to control the switching-on or switching-off of a loop in which the battery system is located, and an above-mentioned arc discharge detection device of a battery system. The arc discharge detection device for a battery system is integrated in the battery system or the controller.

Summing up the above, the present disclosure applies to provide an arc discharge detection method and device for a battery system. Wherein in the arc discharge detection method for a battery system, on the basis of that the charging and discharging current signal of the battery system is collected through the sensor, collecting of the voltage signal of the battery system is added, the time-frequency domain of the voltage and current signals is analyzed and calculated to judge whether the arc discharge features of the battery system are met, and then to determine whether there is an arc in the loop where the battery system is located, and if it is judged that there is an arc fault, an alarm signal is generated to the controller of the battery system or other devices (such as energy storage inverters) that can disconnect the charging and discharging loop of the battery system, the path of the arc current is cut off, and the purpose of extinguishing the arc is achieved. The present disclosure can improve the safety of the widely used battery system to a certain extent, and prevent the arc discharge of the battery system circuit caused by loose connection points and poor contact in the battery system, which might ignite the battery system to cause a fire. In addition, the device of the present disclosure can further upload the raw data in different states, which is convenient for the adjustment and evolution of subsequent detection methods and the rapid solution of on-site misoperation problems. It has good practical application value and safety value.

The embodiments described above are only for illustrating the technical concepts and features of the present disclosure, and are intended to make those skilled in the art being able to understand the present disclosure and thereby implement it, and should not be concluded to limit the protective scope of this disclosure.

Although the present invention has been disclosed in the form of embodiments and variations thereon, it will be understood that numerous additional modifications and variations could be made thereto without departing from the scope of the invention.

For the sake of clarity, it is to be understood that the use of 'a' or 'an' throughout this application does not exclude a plurality, and 'comprising' does not exclude other steps or elements.

What is claimed is:

1. An arc discharge detection method for a battery system, configured for detecting whether an arc discharge fault occurs in the battery system, wherein the arc discharge detection method for a battery system comprises:

performing at least one of a first operation or a second operation, wherein the first operation is sampling a terminal voltage of the battery system twice and calculating a voltage difference value between two sampled terminal voltages as a first voltage difference value, and the second operation is sampling a terminal voltage $v_1$ of the battery system and a terminal voltage $v_2$ of an electricity load connected to the battery system at the same time and calculating a voltage difference value between $v_1$ and $v_2$ as a second voltage difference value;

performing at least one of a third operation, a fourth operation, a fifth operation, or a sixth operation, wherein the third operation is sampling a terminal voltage of the battery system, and performing time domain analysis on a sampled terminal voltage data of the battery system to obtain a voltage time-domain feature value of the battery system, the fourth operation is sampling a terminal voltage of the battery system, and performing frequency domain analysis on a sampled terminal voltage data of the battery system to obtain a voltage frequency-domain feature value of the battery system, the fifth operation is sampling a charging and discharging current of the battery system, and performing time domain analysis on a sampled charging and discharging current data of the battery system to obtain a current time-domain feature value of the battery system, and the sixth operation is sampling a charging and discharging current of the battery system, and performing frequency domain analysis on a sampled charging and discharging current data of the battery system to obtain a current frequency-domain feature value of the battery system; and determining, on the basis of at least one of the current time-domain feature value, the current frequency-domain feature value, the voltage time-domain feature value and the voltage frequency-domain feature value, or at least one of the first voltage difference value or the second voltage difference value, whether an arc discharge fault occurs in the battery system, wherein criteria for judging whether at least one of the current time-domain feature value, the current frequency-domain feature value, the voltage time-domain feature value and the voltage frequency-domain feature value, or at least one of the first voltage difference value or the second voltage difference value meet arc discharge feathers comprise: criterion 1: the current time-domain feature value exceeds a preset current time-domain feature value threshold; criterion 2: the current frequency-domain feature value exceeds a preset current frequency-domain feature value threshold; criterion 3: the voltage time-domain feature value exceeds a preset voltage time-domain feature value threshold; criterion 4: the voltage frequency-domain feature value exceeds a preset voltage frequency-domain feature value threshold; criterion 5: the first voltage difference value exceeds a preset voltage difference threshold of the battery system; and criterion 6: the second voltage difference value exceeds a preset threshold for voltage difference between systems, when at least one of the criterion 5 or the criterion 6 and at least one of the criterion 1, the criterion 2, the criterion 3, or the criterion 4 are satisfied, it is determined that an arc discharge fault occurs in the battery system, and wherein at least one of the current time-domain feature value threshold, the current frequency-domain feature value threshold, the voltage time-domain feature value threshold or the voltage frequency-domain feature value threshold is obtained by the following:

carrying out an arc discharge test of the battery system under arc discharge conditions of the battery system and collecting arc discharge data of the charging and discharging current of the battery system, carrying out an arc discharge-free test of the battery system under arc discharge-free conditions of the battery system and collecting arc discharge-free data of the charging and discharging current of the battery system, and performing time domain analysis on the arc discharge data and the arc discharge-free data of the charging and discharging current of the battery system to obtain arc discharge data and arc discharge-free data of the time-domain feature value of the charging and discharging current of the battery system, and obtaining an intermediate critical value of the two and determining it as the current time-domain feature value threshold;

carrying out an arc discharge test of the battery system under arc discharge conditions of the battery system and collecting arc discharge data of the charging and discharging current of the battery system, carrying out an arc discharge-free test of the battery system under arc discharge-free conditions of the battery system and collecting arc discharge-free data of the charging and discharging current of the battery system, and performing frequency domain analysis on the arc discharge data and the arc discharge-free data of the charging and discharging current of the battery system to obtain arc discharge data and arc discharge-free data of the frequency-domain feature value of the charging and discharging current of the battery system, and obtaining an intermediate critical value of the two and determining it as the current frequency-domain feature value threshold;

carrying out an arc discharge test of the battery system under arc discharge conditions of the battery system and collecting arc discharge data of the terminal voltage of the battery system, carrying out an arc discharge-free test of the battery system under arc discharge-free conditions of the battery system and collecting arc discharge-free data of the terminal voltage of the battery system, and performing time domain analysis on the arc discharge data and the arc discharge-free data of the terminal voltage of the battery system to obtain arc discharge data and arc discharge-free data of the time-domain feature value of the terminal voltage of the battery system, and obtaining an intermediate critical value of the two and determining it as the voltage time-domain feature value threshold; and carrying out an arc discharge test of the battery system under arc discharge conditions of the battery system and collecting arc discharge data of the terminal voltage of the battery system, carrying out an arc discharge-free test of the battery system under arc discharge-free conditions of the battery system and collecting arc discharge-free data of the terminal voltage of the battery system, and performing frequency domain analysis on the arc discharge data and the arc discharge-free data of the terminal voltage of the battery system to obtain arc discharge data and arc discharge-free data of the frequency-domain feature value of the terminal voltage of the battery system, and obtaining an intermediate critical value of the two and determining it as the voltage frequency-domain feature value threshold.

2. The arc discharge detection method for a battery system according to claim 1, wherein:

on the basis of two or more of the current time-domain feature value, the current frequency-domain feature value, the voltage time-domain feature value and the voltage frequency-domain feature value, and the first voltage difference value, and the second voltage difference value, it is determined whether an arc discharge fault occurs in the battery system;

on the basis of one of the current time-domain feature value, the current frequency-domain feature value, the voltage time-domain feature value and the voltage frequency-domain feature value, and the first voltage difference value and the second voltage difference value, it is determined whether an arc discharge fault occurs in the battery system;

on the basis of at least two of the current time-domain feature value, the current frequency-domain feature value, the voltage time-domain feature value and the voltage frequency-domain feature value, and one of the first voltage difference value and the second voltage difference value, it is determined whether an arc discharge fault occurs in the battery system; or on the basis of one of the current time-domain feature value, the current frequency-domain feature value, the voltage time-domain feature value and the voltage frequency-domain feature value, and one of the first voltage difference value and the second voltage difference value, it is determined whether an arc discharge fault occurs in the battery system.

3. The arc discharge detection method for a battery system according to claim 1, further comprising judging at least one of the criterion 5 or the criterion 6 at the same time when judging at least one of the criterion 1, the criterion 2, the criterion 3, or the criterion 4, and when the criterion 5 or the criterion 6 is true and at least one of the criterion 1, the criterion 2, the criterion 3, or the criterion 4 is true, it is determined that an arc discharge fault occurs in the battery system.

4. The arc discharge detection method for a battery system according to claim 1, further comprising judging the criterion 5 and the criterion 6 first, and when the first voltage difference value does not exceed the preset voltage difference threshold of the battery system and the second voltage difference value does not exceed the preset threshold for voltage difference between systems, it is determined that there is no arc discharge fault in the battery system.

5. The arc discharge detection method for a battery system according to claim 4, further comprising, when the first voltage difference value exceeds the preset voltage difference threshold of the battery system and the second voltage difference value exceeds the preset threshold for voltage difference between systems, judging at least one of the criterion 1, the criterion 2, the criterion 3, or the criterion 4, and when at least one of the criterion 1, the criterion 2, the criterion 3, or the criterion 4 is true, it is determined that an arc discharge fault occurs in the battery system; when not, it is determined that there is no arc discharge fault in the battery system.

6. The arc discharge detection method for a battery system according to claim 1, further comprising judging at least one of the criterion 1, the criterion 2, the criterion 3, or the criterion 4, and when the result is that none of the criteria is true, it is determined that there is no arc discharge fault in the battery system.

7. The arc discharge detection method for a battery system according to claim 6, further comprising, when the result is that at least one of the following criteria is true:

judging the criterion 5; when the criterion 5 is true, it is determined that an arc discharge fault occurs in the battery system; when not, continuing to judge the criterion 6; when the criterion 6 is true, it is determined that an arc discharge fault occurs in the battery system; when not, it is determined that there is no arc discharge fault in the battery system; or judging the criterion 6; when the criterion 6 is true, it is determined that an arc discharge fault occurs in the battery system; when not, continuing to judge the criterion 5; when the criterion 5 is true, it is determined that an arc discharge fault occurs in the battery system; when not, it is determined that there is no arc discharge fault in the battery system.

8. The arc discharge detection method for a battery system according to claim 1, wherein at least one of the voltage difference threshold of the battery system or the threshold for voltage difference between systems is obtained by the following:

carrying out an arc discharge test of the battery system under arc discharge conditions of the battery system and collecting arc discharge data of the first voltage difference value, carrying out an arc discharge-free test of the battery system under arc discharge-free conditions of the battery system and collecting arc discharge-free data of the first voltage difference value, and based on the arc discharge data and the arc discharge-free data of the first voltage difference value, obtaining an intermediate critical value of the two and determining it as the voltage difference threshold of the battery system; and carrying out an arc discharge test of the battery system under arc discharge conditions of the battery system and collecting arc discharge data of the second voltage difference value, carrying out an arc discharge-free test of the battery system under arc discharge-free conditions of the battery system and collecting arc discharge-free data of the second voltage difference value, and based on the arc discharge data and the arc discharge-free data of the second voltage difference value, obtaining an intermediate critical value of the two and determining it as the threshold for voltage difference between systems.

9. The arc discharge detection method for a battery system according to claim 1, further comprising determining a position of an arc discharge occurrence after determining that an arc discharge fault has occurred in the battery system through the following ways:

judging whether the criterion 5 is true; when true, determining that the arc discharge occurs at an internal connection point of the battery system; or judging whether the criterion 6 is true; when true, determining that the arc discharge occurs between the battery system and the electricity load.

10. An arc discharge detection device for a battery system, configured for detecting whether an arc discharge fault occurs in the battery system, wherein the arc discharge detection device for a battery system comprises:

a sensor module, configured to sample a terminal voltage and a charging and discharging current of the battery system, and to sample a terminal voltage of an electricity load connected to the battery system; and a processor module, the processor module being connected to the sensor module, and configured to process sampled data from the sensor module to analyze whether an arc discharge fault occurs in the battery system, which comprises:

performing at least one of first operation or second operation, wherein the first operation is calculating a voltage difference value of the terminal voltage of the battery system obtained by two samplings as a first voltage difference value, and the second operation is calculating a voltage difference value between a terminal voltage $v_1$ of the battery system and a terminal voltage $v_2$ of the electricity load connected to the battery system sampled at the same time as a second voltage difference value;

performing at least one of third operation, fourth operation, fifth operation, or sixth operation, wherein the third operation is performing time domain analysis on a sampled terminal voltage data of the battery system to obtain a voltage time-domain feature value of the battery system, the fourth operation is performing frequency domain analysis on a sampled terminal voltage data of the battery system to obtain a voltage frequency-domain feature value of the battery system, the fifth operation is sampling a charging and discharging current of the battery system, and performing time domain analysis on a sampled charging and discharging current data of the battery system to obtain a current time-domain feature value of the battery system, and the sixth operation is sampling a charging and discharging current of the battery system, and performing frequency domain analysis on a sampled charging and discharging current data of the battery system to obtain a current frequency-domain feature value of the battery system, determining, on the basis of at least one of the current time-domain feature value, the current frequency-domain feature value, the voltage time-domain feature value, or the voltage frequency-domain feature value, and at least one of the first voltage difference value or the second voltage difference value, whether an arc discharge fault occurs in the battery system, wherein the following criteria are preset in the processor module, and comprises:

criterion 1: the current time-domain feature value exceeds a preset current time-domain feature value threshold;

criterion 2: the current frequency-domain feature value exceeds a preset current frequency-domain feature value threshold;

criterion 3: the voltage time-domain feature value exceeds a preset voltage time-domain feature value threshold;

criterion 4: the voltage frequency-domain feature value exceeds a preset voltage frequency-domain feature value threshold;

criterion 5: the first voltage difference value exceeds a preset voltage difference threshold of the battery system; and criterion 6: the second voltage difference value exceeds a preset threshold for voltage difference between systems, and wherein it is determined that an arc discharge fault occurs in the battery system if the processor module determines that at least one of the criterion 5 or the criterion 6 and at least one of the criterion 1, the criterion 2, the criterion 3 or the criterion 4 are satisfied.

11. The arc discharge detection device for a battery system according to claim 10, wherein the processor module is further configured to determine:

whether an arc discharge fault occurs in the battery system on the basis of two or more of the current time-domain feature value, the current frequency-domain feature value, the voltage time-domain feature value and the voltage frequency-domain feature value, and the first voltage difference value, or the second voltage difference value;

whether an arc discharge fault occurs in the battery system on the basis of one of the current time-domain feature value, the current frequency-domain feature value, the voltage time-domain feature value and the voltage frequency-domain feature value, and the first voltage difference value and the second voltage difference value;

whether an arc discharge fault occurs in the battery system on the basis of at least two of the current time-domain feature value, the current frequency-domain feature value, the voltage time-domain feature value and the voltage frequency-domain feature value, and one of the first voltage difference value and the second voltage difference value; or whether an arc discharge fault occurs in the battery system on the basis of one of the current time-domain feature value, the current frequency-domain feature value, the voltage time-domain feature value and the voltage frequency-domain feature value, and one of the first voltage difference value and the second voltage difference value.

12. The arc discharge detection device for a battery system according to claim 10, wherein the arc discharge detection device for a battery system further comprises a filtering and sampling circuit arranged between the sensor module and the processor module for filtering and amplifying a sampled signal output by the sensor module, and transmitting processed signal to the processor module.

13. The arc discharge detection device for a battery system according to claim 10, wherein the sensor module comprises a voltage sensor and a current sensor.

14. The arc discharge detection device for a battery system according to claim 10, wherein the arc discharge detection device for a battery system further comprises a communication circuit, wherein the communication circuit is connected to the processor module and also connected to a controller capable of controlling switching-on or switching-off of a loop in which the battery system is located, and the processor module is configured to output a trigger signal to the controller through the communication circuit when it is determined that an arc discharge fault has occurred in the battery system.

15. The arc discharge detection device for a battery system according to claim 10, wherein the processor module is further configured to determine a position of an arc discharge occurrence through the following ways after it is determined that an arc discharge fault has occurred in the battery system:

performing at least one of the following judging operations:

judging whether the criterion 5 is true; when true, determining that the arc discharge occurs at an internal connection point of the battery system; or judging whether the criterion 6 is true; when true, determining that the arc discharge occurs between the battery system and the electricity load.

16. A battery energy storage system, comprising a battery system, and a controller for controlling switching-on or switching-off of a loop in which the battery system is located, wherein the battery energy storage system further comprises the arc discharge detection device for a battery system according to claim 10, the processor module of the arc discharge detection device for a battery system configured to output a trigger signal to the controller through a communication circuit when it is determined that an arc discharge fault has occurred in the battery system, so that the controller disconnects the loop in which the battery system is located.

17. The battery energy storage system according to claim 16, wherein the arc discharge detection device for a battery system is integrated in the battery system or the controller.

\* \* \* \* \*